(12) United States Patent
Matsui et al.

(10) Patent No.: US 11,640,104 B2
(45) Date of Patent: May 2, 2023

(54) LIGHT SOURCE DEVICE HAVING A SEALING MEMBER, METHOD OF MANUFACTURING THE LIGHT SOURCE DEVICE, AND PROJECTOR INCLUDING THE LIGHT SOURCE DEVICE

(71) Applicant: Panasonic Intellectual Property Management Co., Ltd., Osaka (JP)

(72) Inventors: Shigeyoshi Matsui, Osaka (JP); Shigekazu Yamagishi, Osaka (JP); Toshihiko Matsuda, Osaka (JP); Makoto Morita, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 17/345,783

(22) Filed: Jun. 11, 2021

(65) Prior Publication Data
US 2021/0389651 A1 Dec. 16, 2021

(30) Foreign Application Priority Data

Jun. 15, 2020 (JP) .............................. JP2020-103149
May 31, 2021 (JP) .............................. JP2021-090766

(51) Int. Cl.
*G03B 21/16* (2006.01)
*H05K 7/20* (2006.01)
(52) U.S. Cl.
CPC ........... *G03B 21/16* (2013.01); *H05K 7/2039* (2013.01)

(58) Field of Classification Search
CPC ..... F21V 29/54; G03B 21/16; G03B 21/2033; H05K 7/2039; H01S 3/025; H01S 3/027; H01S 3/0405; H01S 3/042
See application file for complete search history.

(56) References Cited

U.S. PATENT DOCUMENTS 5,832,015 A * 11/1998 Goto ....................... H01S 3/025
372/75
6,639,360 B2 * 10/2003 Roberts ................ H05K 1/0209
313/499

(Continued)

FOREIGN PATENT DOCUMENTS

| JP | 58-175655 | 11/1983 |
|----|-----------|---------|
| JP | 58-220484 | 12/1983 |

(Continued)

*Primary Examiner* — Bao-Luan Q Le
(74) *Attorney, Agent, or Firm* — Wenderoth, Lind & Ponack, L.L.P.

(57) ABSTRACT

A light source device includes: a light emitting element; a heat slinger including a first surface in contact with the light emitting element and a second surface opposite to the first surface; a thermoelectric element including a heat absorbing surface in contact with the second surface and a heat radiating surface opposite to the heat absorbing surface, the thermoelectric element producing a temperature difference upon having current flowing in the thermoelectric element; a heat sink in contact with the heat radiating surface; a frame body that is open in a stacking direction of the light emitting element, the heat slinger, the thermoelectric element, and the heat sink, and supports the light emitting element, the heat slinger, the thermoelectric element, and the heat sink in a stacked state; and a sealing member that is filled in the frame body to cover the heat slinger and the thermoelectric element.

9 Claims, 7 Drawing Sheets

(56) References Cited

U.S. PATENT DOCUMENTS

| | | | | |
|---|---|---|---|---|
| 7,075,112 | B2* | 7/2006 | Roberts | G02B 3/0056 257/E23.087 |
| 7,489,031 | B2* | 2/2009 | Roberts | H05B 33/04 257/E51.032 |
| 8,288,783 | B2* | 10/2012 | Kinomoto | C09K 11/62 257/89 |
| 2002/0149312 | A1* | 10/2002 | Roberts | F21V 29/56 257/E23.087 |
| 2003/0030060 | A1* | 2/2003 | Okazaki | H01L 33/504 257/79 |
| 2004/0113549 | A1* | 6/2004 | Roberts | G02B 3/0056 257/E23.087 |
| 2006/0244118 | A1* | 11/2006 | Roberts | H01L 33/648 257/E23.087 |
| 2011/0101387 | A1* | 5/2011 | Kinomoto | H01L 33/504 257/89 |
| 2013/0003393 | A1 | 1/2013 | Chiba et al. | |
| 2014/0028173 | A1* | 1/2014 | Tsuchiya | H01L 33/644 313/46 |
| 2016/0372640 | A1* | 12/2016 | Ogawa | C09D 183/08 |
| 2017/0018678 | A1* | 1/2017 | Fukagawa | H01L 33/0095 |
| 2017/0166807 | A1* | 6/2017 | Kuzumoto | C09K 11/025 |
| 2017/0167693 | A1* | 6/2017 | Yamazumi | C09K 11/08 |
| 2018/0004040 | A1* | 1/2018 | Kuramoto | G02B 19/0014 |
| 2022/0158042 | A1* | 5/2022 | Odawara | C09K 11/77348 |

FOREIGN PATENT DOCUMENTS

| | | |
|---|---|---|
| JP | 2005-209959 | 8/2005 |
| JP | 2006-310138 | 11/2006 |
| JP | 2007-173397 | 7/2007 |
| JP | 2017-112202 | 6/2017 |
| JP | 2017-195354 | 10/2017 |
| WO | 2011/108571 | 9/2011 |

* cited by examiner

LIGHT SOURCE DEVICE HAVING A SEALING MEMBER, METHOD OF MANUFACTURING THE LIGHT SOURCE DEVICE, AND PROJECTOR INCLUDING THE LIGHT SOURCE DEVICE

BACKGROUND

1. Technical Field

The present disclosure relates to a light source device, a method of manufacturing the same, and a projector including the light source device.

2. Description of the Related Art

For example, Patent Literature 1 (Unexamined Japanese Patent Publication No. 2006-310138) discloses a light emitting unit (light source device) enabling prevention of entry of moisture into a connection portion between a power receiving terminal and a connection terminal of a light emitting element. In this light source device, the light emitting element is attached to a bottom surface of a recess portion formed in a heat sink, and is covered with a sealing member made of an insulating resin material that is filled in the recess. With this configuration, moisture is prevented from entering the power receiving terminal of the light emitting element from the outside.

SUMMARY

A light source device may include a Peltier element for highly efficiently cooling a light emitting element. Unfortunately, the cooling using the Peltier element may cause dew condensation in the light source device. Specifically, dew condensation may occur in a portion of the light source device that is exposed to the outside air and has a temperature lower than a dew point temperature of the outside air due to cooling using the Peltier element. The dew condensation (water) may cause corrosion or short circuit.

In view of this, an object of the present disclosure is to suppress generation of dew condensation in a light source device including a thermoelectric element such as a Peltier element.

In order to achieve the above object, one aspect of the present disclosure provides a light source device including:

a light emitting element;

a heat slinger including a first surface in contact with the light emitting element and a second surface opposite to the first surface;

a thermoelectric element including a heat absorbing surface in contact with the second surface of the heat slinger and a heat radiating surface opposite to the heat absorbing surface, the thermoelectric element producing a temperature difference upon having current flowing in the thermoelectric element;

a heat sink in contact with the heat radiating surface of the thermoelectric element;

a frame body that is open in a stacking direction of the light emitting element, the heat slinger, the thermoelectric element, and the heat sink, and supports the light emitting element, the heat slinger, the thermoelectric element, and the heat sink in a stacked state; and a sealing member that is filled in the frame body to cover the heat slinger and the thermoelectric element.

Further, another aspect of the present disclosure provides a method of manufacturing a light source device, the method including:

supporting a light emitting element, a heat slinger including a first surface in contact with the light emitting element and a second surface opposite to the first surface, a thermoelectric element including a heat absorbing surface in contact with the second surface of the heat slinger and a heat radiating surface opposite to the heat absorbing surface, the thermoelectric element producing a temperature difference upon having current flowing in the thermoelectric element, and a heat sink in contact with the heat radiating surface of the thermoelectric element in a frame body that is open in a stacking direction of the light emitting element, the heat slinger, the thermoelectric element, and the heat sink in a stacked state;

filling the frame body with a sealing member having fluidity to cover the heat slinger and the thermoelectric element; and curing the sealing member that is filled in the frame body.

Further, a different aspect of the present disclosure provides a projector including the above light source device.

According to the present disclosure, the occurrence of dew condensation in a light source device including a thermoelectric element such as a Peltier element can be suppressed.

DETAILED DESCRIPTION

A light source device according to one aspect of the present disclosure includes: a light emitting element; a heat slinger including a first surface in contact with the light emitting element and a second surface opposite to the first surface; a thermoelectric element including a heat absorbing surface in contact with the second surface of the heat slinger and a heat radiating surface opposite to the heat absorbing surface, the thermoelectric element producing a temperature difference upon having current flowing in the thermoelectric element; a heat sink in contact with the heat radiating surface of the thermoelectric element; a frame body that is open in a stacking direction of the light emitting element, the heat slinger, the thermoelectric element, and the heat sink, and supports the light emitting element, the heat slinger, the thermoelectric element, and the heat sink in a stacked state; and a sealing member that is filled in the frame body to cover the heat slinger and the thermoelectric element.

According to such an aspect, the occurrence of dew condensation in a light source device including a thermoelectric element such as a Peltier element can be suppressed.

For example, the frame body may be made of a material having thermal conductivity lower than thermal conductivity of the heat slinger, the frame body may include: a first recess portion including a first opening open on one side in the stacking direction; and a second recess portion including a second opening that is open on another side in the stacking direction and is larger than the first opening, and a bottom surface connected to the first recess portion. In this case, the heat slinger is supported by the frame body in a state where a part of the first surface is seated on the bottom surface of the second recess portion. The sealing member that is filled in the first recess portion forms a first sealing portion, and the sealing member that is filled in the second recess portion forms a second sealing portion.

For example, a thickness of the second sealing portion from the second surface of the heat slinger may be smaller than a thickness of the thermoelectric element.

For example, at least one of the first sealing portion and the second sealing portion may contain foaming particles having thermal conductivity lower than thermal conductivity of the sealing member.

For example, the light source device may include a heat insulating member provided to at least one of the first surface and the second surface of the heat slinger. In this case, the heat insulating member is covered with the first sealing portion or the second sealing portion.

For example, the frame body may include an attachment flat surface that is parallel to the bottom surface of the second recess portion and is in surface contact with an external member.

For example, the light emitting element may be a laser light source that emits a laser beam.

A method of manufacturing a light source device according to another aspect of the present disclosure includes: supporting a light emitting element, a heat slinger including a first surface in contact with the light emitting element and a second surface opposite to the first surface, a thermoelectric element including a heat absorbing surface in contact with the second surface of the heat slinger and a heat radiating surface opposite to the heat absorbing surface, the thermoelectric element producing a temperature difference upon having current flowing in the thermoelectric element, and a heat sink in contact with the heat radiating surface of the thermoelectric element in a frame body that is open in a stacking direction of the light emitting element, the heat slinger, the thermoelectric element, and the heat sink in a stacked state; filling the frame body with a sealing member having fluidity to cover the heat slinger and the thermoelectric element; and curing the sealing member that is filled in the frame body.

According to such an aspect, the occurrence of dew condensation in a light source device including a thermoelectric element such as a Peltier element can be suppressed.

A projector according to a different aspect of the present disclosure includes the above light source device.

According to such an aspect, the occurrence of dew condensation in a light source device for a projector can be suppressed.

Hereinafter, exemplary embodiments of the present disclosure will be described with reference to the drawings. It is noted that a more detailed description than need may be omitted. For example, the detailed description of already well-known matters and the overlap description of substantially same configurations may be omitted. This is to avoid an unnecessarily redundant description below and to facilitate understanding of a person skilled in the art.

Note that the attached drawings and the following description are provided for those skilled in the art to fully understand the present disclosure, and are not intended to limit the subject matter as described in the appended claims.

First Exemplary Embodiment

Hereinafter, a light source device according to a first exemplary embodiment will be described with reference to FIGS. 1 to 4.

Figure 1:
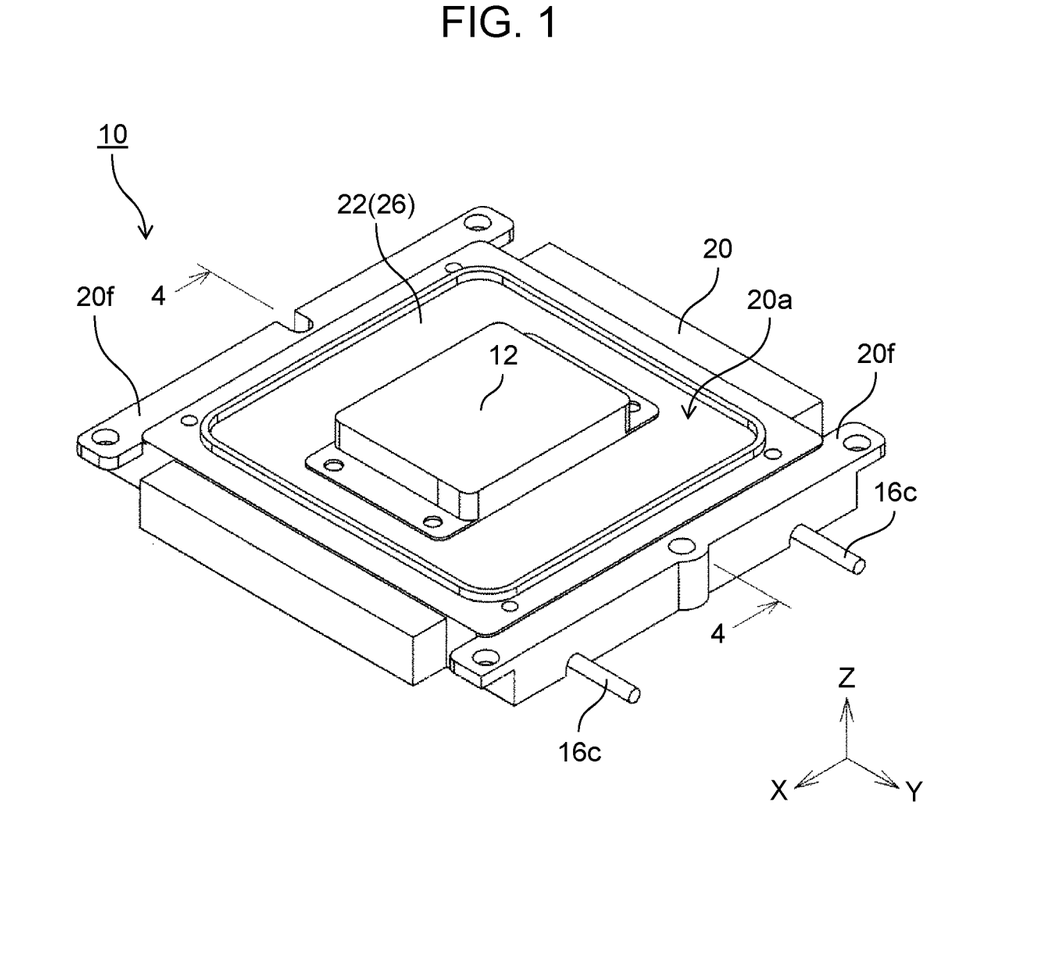
FIG. 1 is an upper perspective view of a light source device according to a first exemplary embodiment of the present disclosure.
Figure 2:
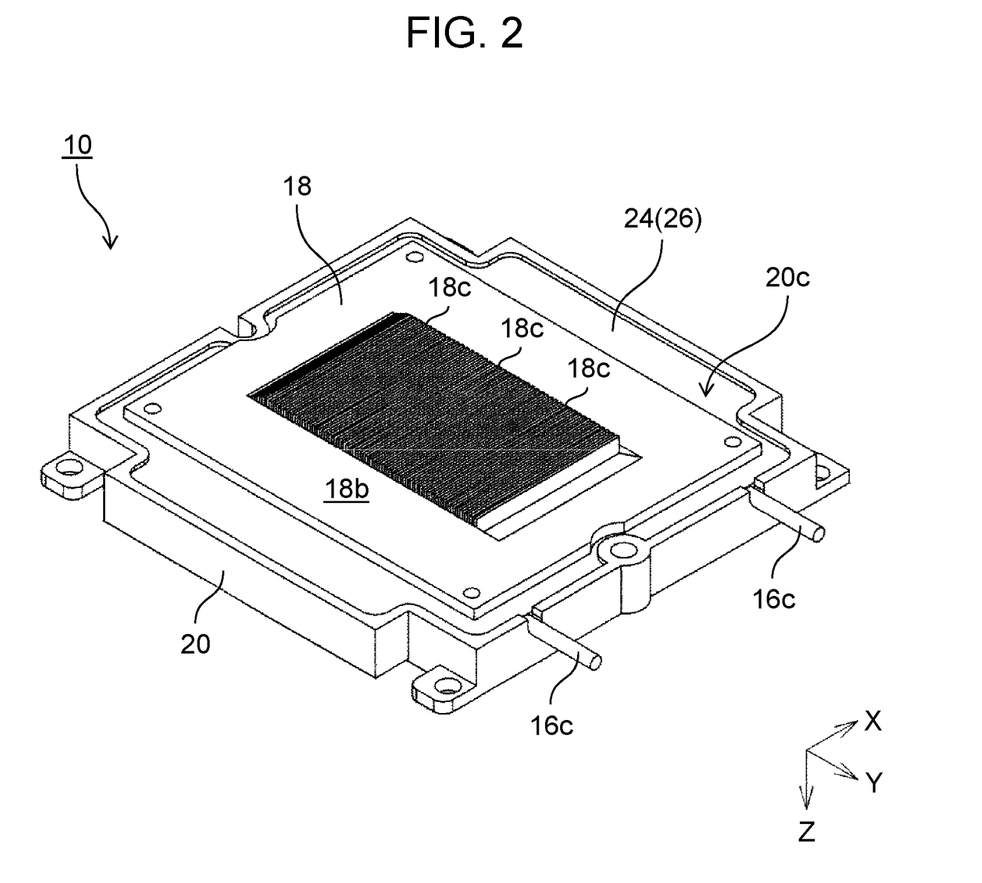
FIG. 2 is a lower perspective view of the light source device according to the first exemplary embodiment.
Figure 3:
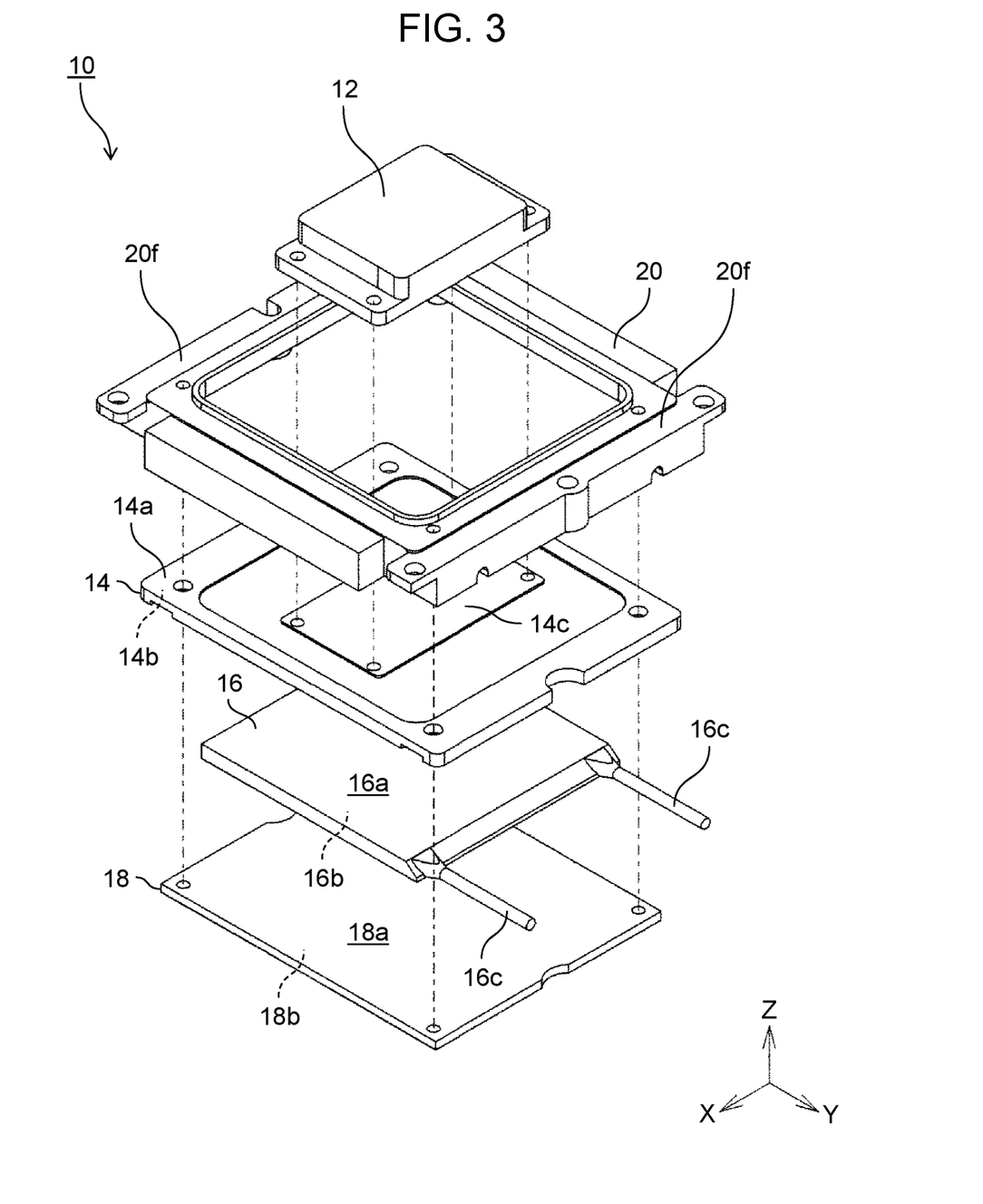
FIG. 3 is an exploded perspective view of the light source device according to the first exemplary embodiment.
Figure 4:
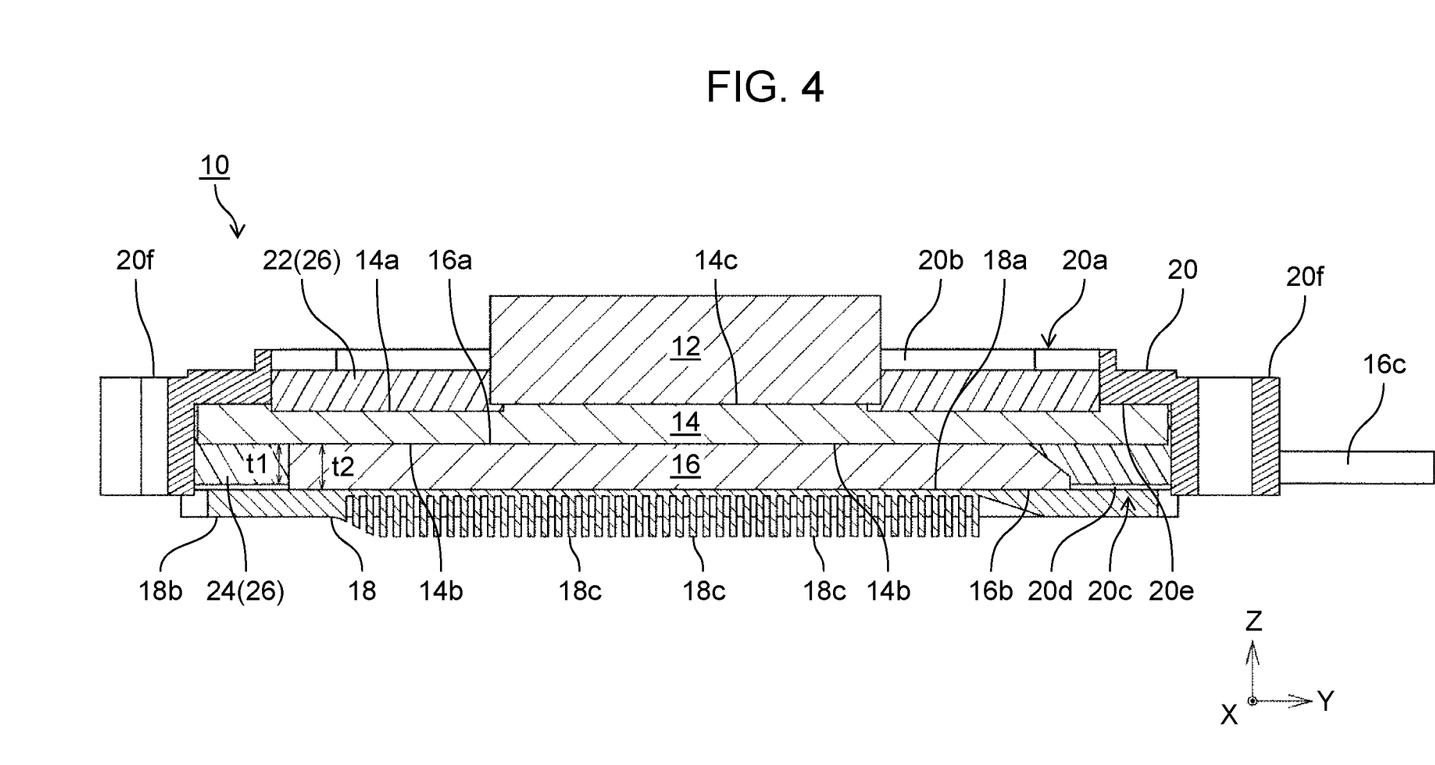
FIG. 4 is a cross-sectional view of the light source device taken along line 4-4 in FIG. 1.

FIG. 1 is an upper perspective view of the light source device according to the present first exemplary embodiment. FIG. 2 is a lower perspective view of the light source device according to the present first exemplary embodiment. FIG. 3 is an exploded perspective view of the light source device according to the present first exemplary embodiment. FIG. 4 is a cross-sectional view of the light source device taken along line 4-4 in FIG. 1. Note that the X-Y-Z coordinate system illustrated in the drawings is for facilitating understanding of the exemplary embodiments of the present disclosure, and does not limit the exemplary embodiments. The Z-axis direction is a thickness direction of the light source device, and the X-axis direction and the Y-axis direction are planar directions.

As illustrated in FIGS. 1 to 4, light source device 10 according to the present first exemplary embodiment is a device used as a light source of a projector, for example, and includes light emitting element 12, heat slinger 14, Peltier element 16, heat sink 18, and frame body 20.

Light emitting element 12 is a device emitting light which is, for example, a laser light source that emits a laser beam with directivity, and emits the laser beam in the thickness direction (Z-axis direction) of light source device 10.

Heat slinger 14 is a plate-like member made of a material having high thermal conductivity which is, for example, a metal material such as aluminum, and includes first surface 14a and second surface 14b opposite to first surface 14a. First surface 14a of heat slinger 14 is provided with heat absorbing portion 14c that is in contact with light emitting element 12 and absorbs heat of light emitting element 12.

Peltier element 16 includes heat absorbing surface 16a that is in contact with second surface 14b of heat slinger 14 and absorbs heat of heat slinger 14, heat radiating surface 16b opposite to heat absorbing surface 16a, and a power supply line 16c for receiving power supply. Peltier element 16 produces a temperature difference between heat absorbing surface 16a and heat radiating surface 16b, upon having current flowing therein due to the power supply received through power supply line 16c. Peltier element 16 is an example of a thermoelectric element having a function of producing a temperature difference upon having current flowing therein.

Heat sink 18 is a member made of a material having high thermal conductivity that is, for example, a metal material such as aluminum, and includes first surface 18a that is in contact with heat radiating surface 16b of Peltier element 16 and second surface 18b opposite to first surface 18a. Second surface 18b is provided with a plurality of heat radiating fins 18c.

Frame body 20 is a frame-shaped member that opens in a stacking direction (Z-axis direction) of light emitting element 12, heat slinger 14, Peltier element 16, and heat sink 18, and serves as a housing of light source device 10. As illustrated in FIG. 4, frame body 20 supports light emitting element 12, heat slinger 14, Peltier element 16, and heat sink 18 in a stacked state.

In the case of the present first exemplary embodiment, frame body 20 is made of a material having thermal conductivity lower than the thermal conductivity of heat slinger 14 which is, for example, a resin material. The reason for this will be described later. As illustrated in FIG. 4, frame body 20 includes first recess portion 20b having first opening 20a open on one side in the stacking direction (Z-axis direction) of light emitting element 12, heat slinger 14, Peltier element 16, and heat sink 18, and second recess portion 20d having second opening 20c open on the other side in the stacking direction. First recess portion 20b is connected to bottom surface 20e of second recess portion 20d, thereby communicating with second recess portion 20d.

In the case of the present first exemplary embodiment, as illustrated in FIG. 4, first surface 14a of heat slinger 14 is partially seated on bottom surface 20e of second recess portion 20d, and thus is supported by frame body 20. In order to suppress heat transfer between heat slinger 14 and frame body 20 through bottom surface 20e, frame body 20 is made of a material having thermal conductivity lower than the thermal conductivity of heat slinger 14.

Further, in the case of the present first exemplary embodiment, light emitting element 12 is fixed to first surface 14a of heat slinger 14 with a screw (not illustrated) while being in contact with heat absorbing portion 14c of heat slinger 14. As a result, light emitting element 12 is supported by frame body 20 via heat slinger 14 while being partially accommodated in first recess portion 20b of frame body 20.

Furthermore, in the case of the present first exemplary embodiment, heat slinger 14, Peltier element 16, and heat sink 18 are fixed to frame body 20 by screws (not illustrated) with Peltier element 16 sandwiched between heat slinger 14 and heat sink 18. Thus, contact between second surface 14b of heat slinger 14 and heat absorbing surface 16a of Peltier element 16 is maintained, and contact between heat radiating surface 16b of Peltier element 16 and first surface 18a of heat sink 18 is maintained. Heat slinger 14 and Peltier element 16 are accommodated in second recess portion 20d of frame body 20.

In addition, in the case of the present first exemplary embodiment, frame body 20 includes attachment flat surface 20f attached to the external member to bring light source device 10 into surface contact with an external member. Thus, frame body 20 functions as a bracket for light source device 10. For example, light source device 10 is attached to the housing of the projector via attachment flat surface 20f of frame body 20, and functions as a part of the projector. This attachment flat surface 20f is parallel to bottom surface 20e of second recess portion 20d and as a result, is also parallel to first surface 14a of heat slinger 14. Light emitting element 12 is attached to heat slinger 14 in such a manner that the traveling direction of the emitted light is substantially orthogonal to first surface 14a of heat slinger 14. Thus, with attachment flat surface 20f used as a reference for positioning, light source device 10 can be attached to an external member which is, for example, the housing of the projector, in a state where the traveling direction of the emitted light is appropriately adjusted. As a result, it is possible to suppress variations in luminance of light projected from light emitting element 12 onto a screen.

With such a structure, the heat of light emitting element 12 is transmitted to heat slinger 14 via first surface 14a of heat slinger 14. The heat of heat slinger 14 is absorbed by Peltier element 16 via heat absorbing surface 16a of Peltier element 16 in contact with its second surface 14b. The heat of Peltier element 16 generated by the heat absorption is transmitted to heat sink 18 via first surface 18a of heat sink 18 in contact with heat radiating surface 16b. Then, the heat of heat sink 18 is radiated to the outside via the plurality of heat radiating fins 18c. For example, heat radiating fins 18c are cooled by cooling water circulating inside the projector or a fan provided in the housing of the projector. Through such heat transfer, Peltier element 16 cools light emitting element 12.

In order to suppress dew condensation due to the cooling by Peltier element 16, as illustrated in FIG. 4, first recess portion 20b and second recess portion 20d of frame body 20 are filled with a sealing member to respectively have first sealing portion 22 and second sealing portion 24 formed therein. Specifically, due to cooling by Peltier element 16, dew condensation may occur on heat slinger 14 and heat absorbing surface 16a of Peltier element 16. In order to suppress such occurrence of dew condensation, a sealing member is filled in first and second recesses 20b, 20d of frame body 20 to cover heat slinger 14 and Peltier element 16.

Specifically, sealing member 26 that is filled in first and second sealing portions 22, 24 has high fluidity, and is made of a curable insulating material which is, for example, a curable resin. Furthermore, sealing member 26 is made of a material having low thermal conductivity. For example, epoxy resin, silicone resin, urethane resin, or the like is used as sealing member 26.

Sealing member 26 forming first sealing portion 22 is filled in first recess portion 20b of frame body 20, while being in a fluid state. Sealing member 26 of first sealing portion 22 is filled in first recess portion 20b so as to cover heat slinger 14 except for heat absorbing portion 14c which is a part of first surface 14a of heat slinger 14 in contact with light emitting element 12. In other words, sealing member 26 is filled in first recess portion 20b in a state where heat slinger 14 is attached to frame body 20 and light emitting element 12 is attached to heat slinger 14. Then, after being filled, sealing member 26 is cured. In the case of the present first exemplary embodiment, light emitting element 12 is partially embedded in first sealing portion 22.

Sealing member 26 forming second sealing portion 24 is filled in second recess portion 20d of frame body 20, while being in a fluid state. Sealing member 26 of second sealing portion 24 is filled in second recess portion 20d so as to cover heat slinger 14 and Peltier element 16 except for a portion of heat radiating surface 16b of Peltier element 16 that is in contact with heat sink 18. In other words, sealing member 26 is filled in second recess portion 20d in a state where heat slinger 14 is attached to frame body 20 and Peltier element 16 is sandwiched between heat slinger 14 and heat sink 18. Then, after being filled, sealing member 26 is cured.

As illustrated in FIG. 4, in the case of the present first exemplary embodiment, heat sink 18 is not buried in second sealing portion 24, so as to be detachable from light source device 10. Therefore, thickness t1 of second sealing portion 24 from second surface 14b of heat slinger 14 is set to be smaller than thickness t2 of Peltier element 16 in contact with second surface 14b of heat slinger 14. With this configuration, heat sink 18 can be attached and detached in a non-destructive manner. As a result, for example, when light emitting element 12 or Peltier element 16 fails, heat sink 18 can be removed from light source device 10 under failure to be reused in new light source device 10.

By being covered with such first and second sealing portions 22, 24, heat slinger 14 and Peltier element 16 are prevented from coming into contact with the outside air, and thus are insulated from the outside air. As a result, occurrence of dew condensation on heat slinger 14 and Peltier element 16 is suppressed. For example, even when heat slinger 14 is cooled to a temperature lower than a dew point temperature of air (outside air) outside light source device 10, dew condensation does not occur on heat sink because heat slinger 14 is covered with first and second sealing portions 22, 24.

First and second sealing portions 22, 24 covering heat slinger 14 and Peltier element 16 are maintained at a temperature between the temperature of heat slinger 14 and Peltier element 16 and the outside air temperature. Sealing member 26 forming first and second sealing portions 22, 24 is made of a material having low thermal conductivity to make such a temperature higher than the dew point temperature of the outside air, that is, to prevent occurrence of dew condensation on the outer surfaces of first and second sealing portions 22, 24.

Frame body 20 is also made of a material having thermal conductivity lower than the thermal conductivity of heat slinger 14, whereby the occurrence of dew condensation thereon is suppressed.

According to the present first exemplary embodiment as described above, the occurrence of dew condensation in light source device 10 including Peltier element 16 can be suppressed.

Second Exemplary Embodiment

The present second exemplary embodiment is an improvement of the first exemplary embodiment described above. Therefore, the present second exemplary embodiment will be described while focusing on differences. Note that components of the present second exemplary embodiment that are substantially the same as the components of the first exemplary embodiment are denoted by the same reference numerals.

Figure 5:
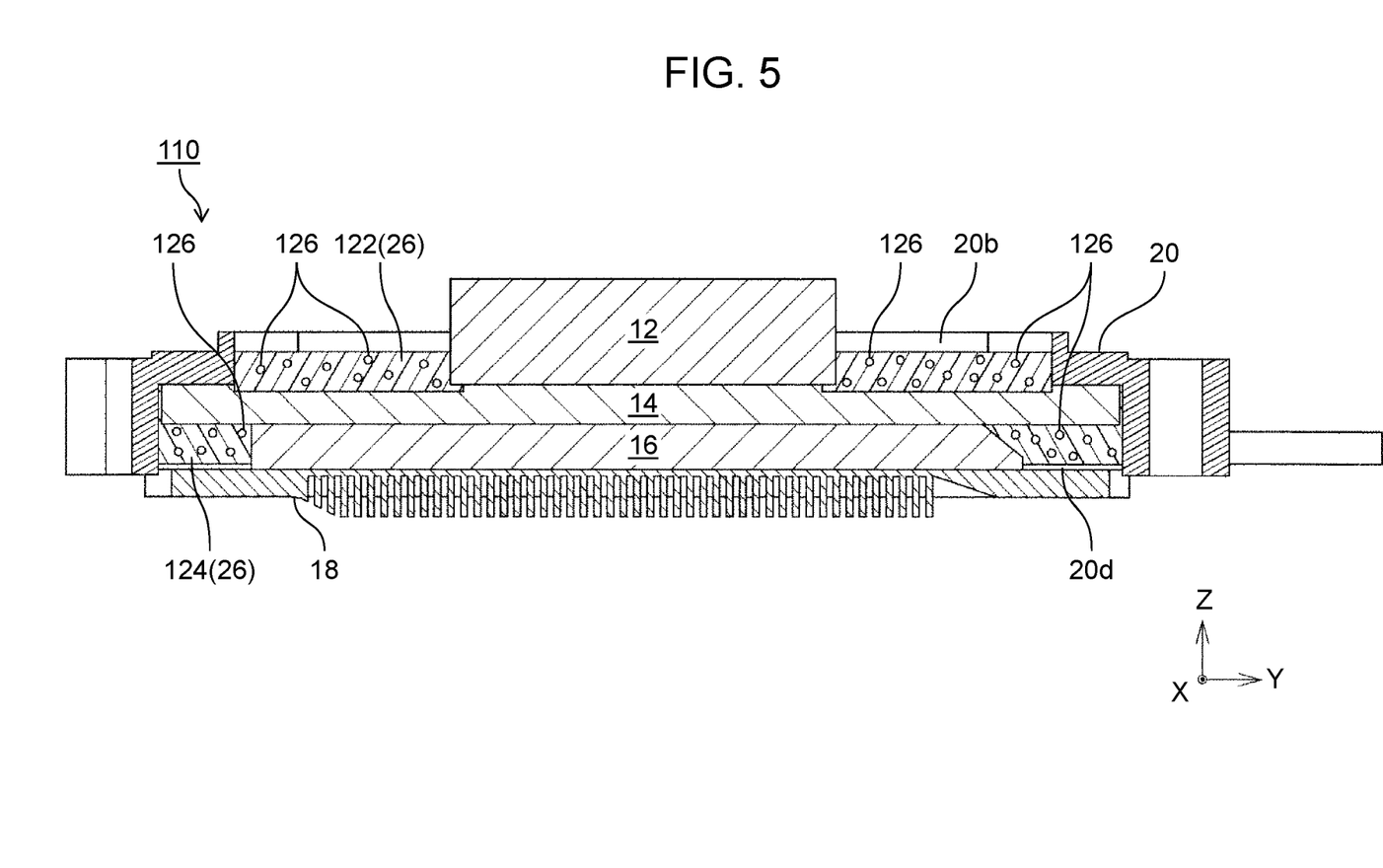
FIG. 5 is a cross-sectional view of a light source device according to a second exemplary embodiment of the present disclosure.

FIG. 5 is a cross-sectional view of a light source device according to the second exemplary embodiment of the present disclosure.

In light source device 110 according to the present second exemplary embodiment, first and second sealing portions 122, 124 contain sealing member 26 as well as foaming particles 126. Foaming particles 126 have thermal conductivity that is lower than the thermal conductivity of sealing member 26.

Heat slinger 14 and Peltier element 16 covered with first and second sealing portions 122, 124 containing such foaming particles 126 are more insulated from the outside air than in a case where foaming particles 126 are not contained. The temperature of the outer surfaces of first and second sealing portions 122, 124 is higher than that in a case where foaming particles 126 are not contained. As a result, dew condensation is even less likely to occur on the outer surfaces.

Foaming particles 126 contained in both first and second sealing portions 122, 124 may alternatively be contained in only one of these. That is, foaming particles 126 are contained in at least one of first sealing portion 122 and second sealing portion 124. For example, foaming particles 126 may be contained in the sealing portion of one of first surface 14a and second surface 14b of heat slinger 14 where dew condensation is more likely to occur.

According to the present second exemplary embodiment as described above, the occurrence of dew condensation in light source device 110 including Peltier element 16 can be suppressed as in the first exemplary embodiment described above.

Third Exemplary Embodiment

The present third exemplary embodiment is an improvement of the first exemplary embodiment described above. Therefore, the present third exemplary embodiment will be described while focusing on differences. Note that components of the present third exemplary embodiment that are substantially the same as the components of the first exemplary embodiment are denoted by the same reference numerals.

Figure 6:
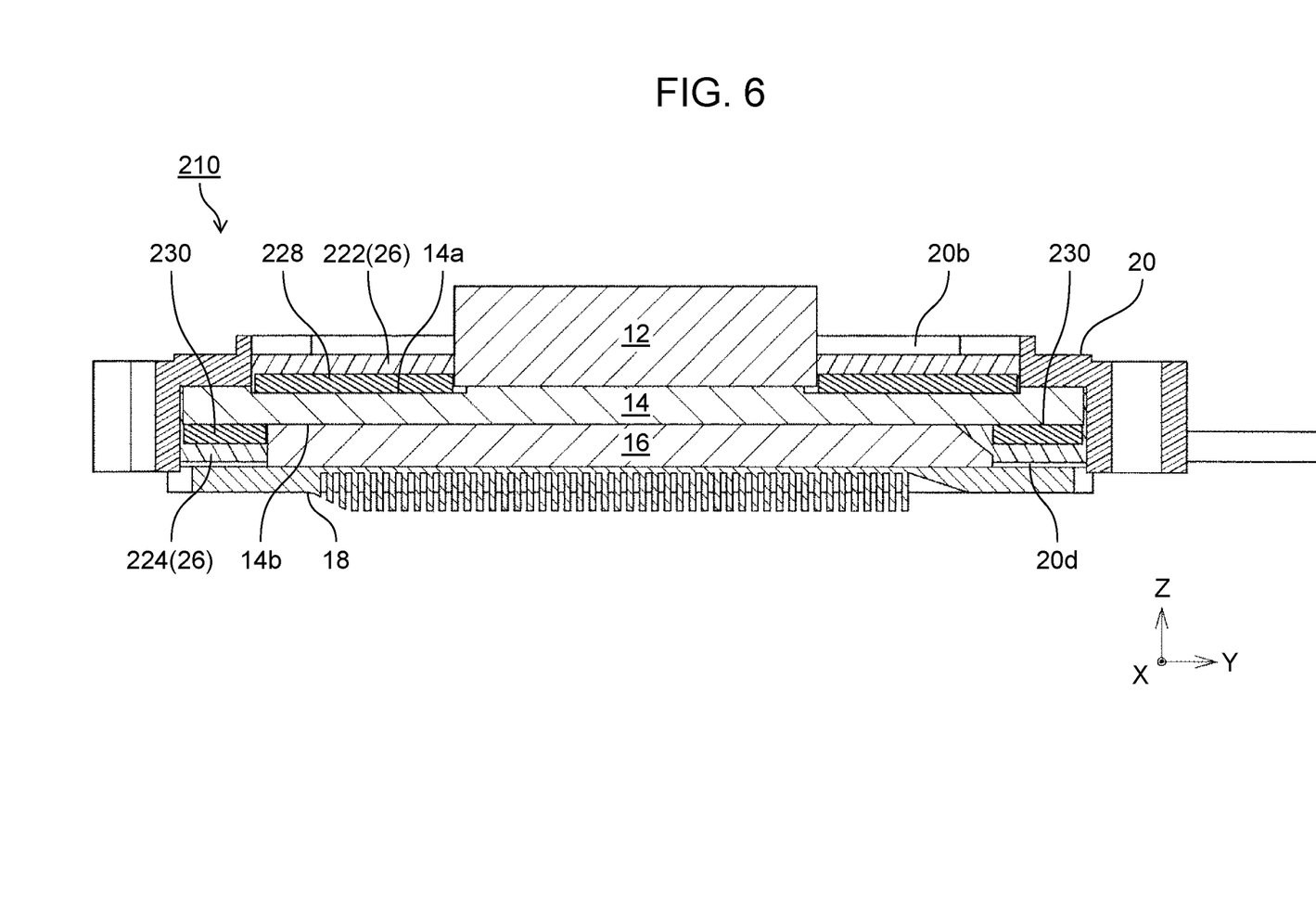
FIG. 6 is a cross-sectional view of a light source device according to a third exemplary embodiment of the present disclosure.
Figure 7:
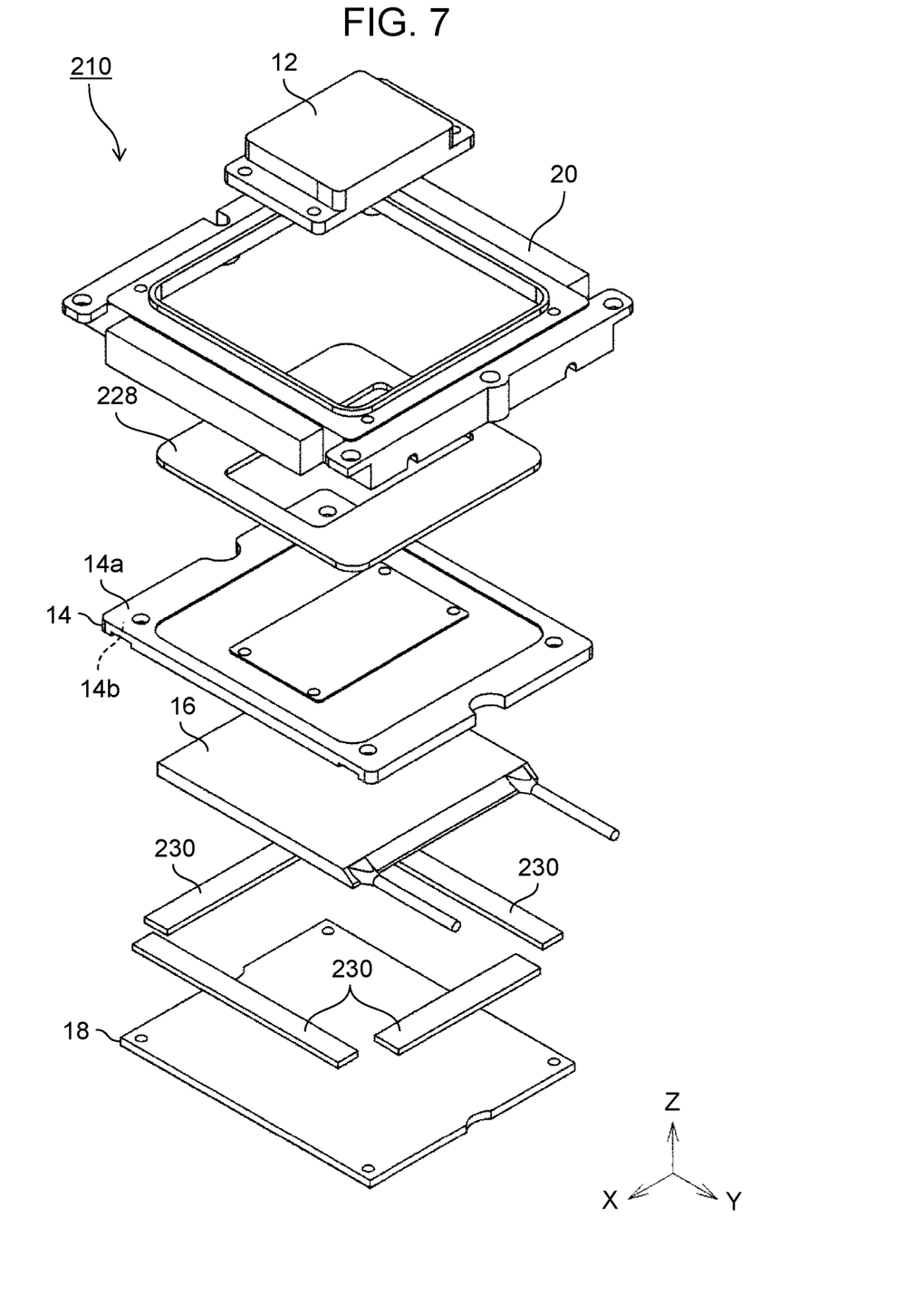
FIG. 7 is an exploded perspective view of the light source device according to the third exemplary embodiment.

FIG. 6 is a cross-sectional view of a light source device according to the third exemplary embodiment of the present disclosure. FIG. 7 is an exploded perspective view of the light source device according to the present third exemplary embodiment.

As illustrated in FIGS. 6 and 7, in light source device 210 according to the present third exemplary embodiment, first and second heat insulating members 228, 230 are attached to portions of heat slinger 14 that are not in contact with light emitting element 12 and Peltier element 16.

First and second heat insulating members 228, 230 are, for example, members that are made of a rubber material and have an independent foaming structure. First heat insulating member 228 is attached to first surface 14a of heat slinger 14, and second heat insulating member 230 is attached to second surface 14b of heat slinger 14.

First heat insulating member 228 is covered with sealing member 26 forming first sealing portion 222. Similarly, second heat insulating member 230 is covered with sealing member 26 forming second sealing portion 224.

Heat slinger 14 and Peltier element 16 covered with first and second sealing portions 222, 224 with such first and second heat insulating members 228, 230 provided in between are more insulated from the outside air than in a case where first and second heat insulating members 228, 230 are not provided (light source device 10 of first exemplary embodiment for example). The temperature of the outer surfaces of first and second sealing portions 222, 224 is higher than that in a case where first and second heat insulating members 228, 230 are not provided. As a result, dew condensation is even less likely to occur on the outer surfaces.

Only one of first heat insulating member 228 and second heat insulating member 230 may be attached to heat slinger 14. Specifically, at least one of first heat insulating member 228 and second heat insulating member 230 is attached to heat slinger 14. For example, a heat insulating member may be attached on the side of the sealing portion of one of first surface 14a and second surface 14b of heat slinger 14 where dew condensation is more likely to occur.

Foaming particles 126 described in the second exemplary embodiment may be contained in at least one of first and second sealing portions 222, 224 of light source device 210.

According to the present third exemplary embodiment as described above, the occurrence of dew condensation in light source device 210 including Peltier element 16 can be suppressed as in the first exemplary embodiment described above.

Although the present disclosure has been described above with reference to the plurality of first to third exemplary embodiments, the exemplary embodiments of the present disclosure are not limited to these.

For example, the Peltier element may be controlled based on a result of temperature detection by a temperature sensor attached to the heat slinger. For example, the Peltier element may be controlled to keep the result of the temperature detection by the temperature sensor, that is, the temperature of the heat slinger constant. In such a case, the temperature sensor may be covered with the first sealing portion or the second sealing portion so as not to be affected by the outside air temperature.

When the temperature sensor is used, the operation of the Peltier element and/or the light emitting element may be stopped when the temperature sensor detects a temperature at which dew condensation may occur on the outer surface of the first sealing portion or the second sealing portion.

Furthermore, in the case of the above-described first exemplary embodiment, as illustrated in FIG. 4, first sealing portion 22 and second sealing portion 24 are divided by heat slinger 14. However, the exemplary embodiment of the present disclosure is not limited to this. The first sealing portion and the second sealing portion may be connected.

As described above, the above exemplary embodiments have been described as examples of the techniques in the present disclosure. To this end, the drawings and detailed description are provided. Thus, in order to exemplify the above-described techniques, the components illustrated in the drawings and described in the detailed description include not only components essential for solving the problem but also components not essential for solving the problem. Therefore, the fact that such non-essential components are illustrated in the drawings or described in the detailed description should not immediately determine that these non-essential components are essential.

Further, since the above-described exemplary embodiments are for exemplifying the techniques in the present disclosure, various changes, replacements, additions, omissions, and the like can be made within the scope of the appended claims or the scope equivalent thereto.

The present disclosure is applicable to a light source device including a thermoelectric element such as a Peltier element.

What is claimed is:

1. A light source device comprising:
   a light emitting element;
   a heat slinger including a first surface in contact with the light emitting element and a second surface opposite to the first surface;
   a thermoelectric element including a heat absorbing surface in contact with the second surface of the heat slinger and a heat radiating surface opposite to the heat absorbing surface, the thermoelectric element producing a temperature difference upon having current flowing in the thermoelectric element;
   a heat sink in contact with the heat radiating surface of the thermoelectric element;
   a frame body that is open in a stacking direction of the light emitting element, the heat slinger, the thermoelectric element, and the heat sink, and supports the light emitting element, the heat slinger, the thermoelectric element, and the heat sink in a stacked state; and
   a sealing member that is filled in the frame body to cover the heat slinger and the thermoelectric element, wherein
   the frame body includes:
      a first recess portion including a first opening open on one side in the stacking direction; and
      a second recess portion including a second opening that is open on another side in the stacking direction and is larger than the first opening, and a bottom surface connected to the first recess portion,
   the heat slinger is supported by the frame body in a state where a part of the first surface is seated on the bottom surface of the second recess portion, and
   the sealing member that is filled in the first recess portion forms a first sealing portion, and the sealing member that is filled in the second recess portion forms a second sealing portion.

2. The light source device according to claim 1, wherein the frame body is made of a material having thermal conductivity lower than thermal conductivity of the heat slinger.

3. The light source device according to claim 2, wherein a thickness of the second sealing portion from the second surface of the heat slinger is smaller than a thickness of the thermoelectric element.

4. The light source device according to claim 2, wherein at least one of the first sealing portion and the second sealing portion contains foaming particles having thermal conductivity lower than thermal conductivity of the sealing member.

5. The light source device according to claim 2 further comprising a heat insulating member provided to at least one of the first surface and the second surface of the heat slinger, wherein the heat insulating member is covered with the first sealing portion or the second sealing portion.

6. The light source device according to claim 2, wherein the frame body includes an attachment flat surface that is parallel to the bottom surface of the second recess portion and is in surface contact with an external member.

7. The light source device according to claim 1, wherein the light emitting element is a laser light source that emits a laser beam.

8. The light source device according to claim 1, wherein the thermoelectric element is a Peltier element.

9. A projector comprising the light source device according to claim 1.

* * * * *